United States Patent
Fujino et al.

(10) Patent No.: US 8,992,701 B2
(45) Date of Patent: Mar. 31, 2015

(54) SILVER POWDER AND METHOD FOR PRODUCING SAME

(75) Inventors: Takatoshi Fujino, Saitama (JP); Kozo Ogi, Saitama (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 13/468,468

(22) Filed: May 10, 2012

(65) Prior Publication Data

US 2012/0219453 A1 Aug. 30, 2012

Related U.S. Application Data

(62) Division of application No. 11/285,140, filed on Nov. 21, 2005, now Pat. No. 8,282,702.

(30) Foreign Application Priority Data

Nov. 25, 2004 (JP) ................................ 2004-340789

(51) Int. Cl.
| | |
|---|---|
| *C22C 5/06* | (2006.01) |
| *H01G 4/008* | (2006.01) |
| *B22F 1/00* | (2006.01) |
| *B22F 9/24* | (2006.01) |
| *H01B 1/22* | (2006.01) |
| *H05K 1/09* | (2006.01) |

(52) U.S. Cl.
CPC ............ *H01G 4/0085* (2013.01); *B22F 1/0011* (2013.01); *B22F 9/24* (2013.01); *H01B 1/22* (2013.01); *C01P 2006/13* (2013.01); *C22C 5/06* (2013.01); *H05K 1/092* (2013.01)
USPC ............ 148/430; 420/501; 428/546; 252/514

(58) Field of Classification Search
CPC ............. C01P 2006/00; C01P 2006/10; C01P 2006/11; C01P 2006/12; C01P 2006/13; C01P 2006/90; C22C 5/06; C22C 2202/00; C22F 1/14

USPC ........... 75/255, 343, 370, 371, 634–636, 710, 75/711, 721, 722, 739–741; 420/501–506; 428/546; 423/23; 252/514; 148/430, 148/431

See application file for complete search history.

(56) References Cited

U.S. PATENT DOCUMENTS 5,045,141 A * 9/1991 Salensky et al. ............... 156/240

FOREIGN PATENT DOCUMENTS

JP 2001-107101 A * 4/2001 ................ B22F 1/00

OTHER PUBLICATIONS

Tables of Physical & Chemical Constants, National Physical Laboratory, Kaye & Laby, Updated: Dec. 2, 2010.*

(Continued)

*Primary Examiner* — Scott Kastler
*Assistant Examiner* — Vanessa Luk
(74) *Attorney, Agent, or Firm* — Bachman & LaPointe, P.C.

(57) ABSTRACT

After a reducing agent is added to a water reaction system containing silver ions to deposit silver particles by reduction, the silver particles are dried to obtain a silver powder which is heat-treated at a temperature of higher than 100° C. and lower than 400° C. The silver powder thus heat-treated has a maximum coefficient of thermal expansion of not greater than 1.5% at a temperature of 50° C. to 800° C., and has no heating peak when the silver powder is heated from 50° C. to 800° C. The silver powder has an ignition loss of not greater than 1.0% when the silver powder is ignited until the weight of the silver powder is constant at 800° C. The silver powder has a tap density of not less than 2 g/cm$^3$ and a BET specific surface area of not greater than 5 m$^2$/g.

5 Claims, 1 Drawing Sheet

(56) References Cited

OTHER PUBLICATIONS

Computer-Generated Translation of JP 2001-107101 (Sasaki et al.), originally published in Japanese on Apr. 17, 2001.*

Smith, David R. and F.R. Fickett "Low-Temperature Properties of Silver," Journal of Research of the National Institute of Standards and Technology, vol. 100 (Mar.-Apr. 1995), No. 2, pp. 119-171.*

* cited by examiner

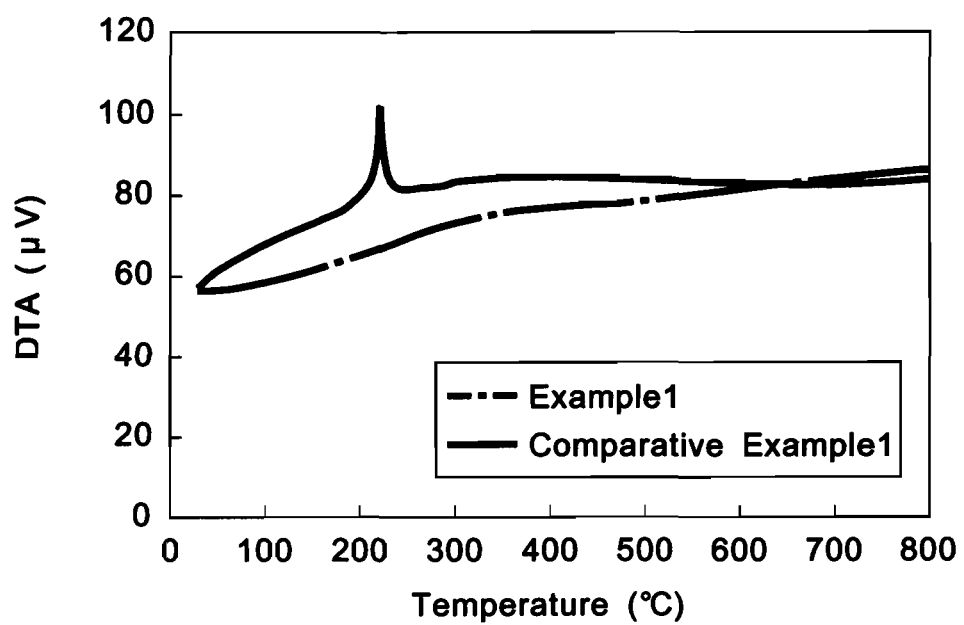

SILVER POWDER AND METHOD FOR PRODUCING SAME

CROSS-REFERENCE TO RELATED APPLICATIONS

This application is a divisional application of U.S. Ser. No. 11/285,140, filed Nov. 21, 2005, now U.S. Pat. No. 8,282,702, issued Oct. 9, 2012.

BACKGROUND OF THE INVENTION

1. Field of the Invention

The present invention generally relates to a silver powder and a method for producing the same. More specifically, the invention relates to a silver powder for a conductive paste for use in electronic parts, such as internal electrodes of multilayer capacitors, and conductive patterns of circuit boards, and a method for producing the same.

2. Description of the Prior Art

In order to form electrodes of hybrid ICs, multilayer ceramic capacitors, chip resistors and so forth, cermet type conductive pastes (or conductive pastes of a type to be fired) have been used. A typical cermet type paste includes a silver powder, a vehicle containing ethyl cellulose or acrylic resin dissolved in an organic solvent, a glass frit, an inorganic oxide, an organic solvent, a dispersing agent and so forth as components. The cermet type paste is formed by dipping or printing so as to have a predetermined pattern, and then, fired to form a conductor. As a method for producing such a silver powder for a conductive paste, there is known a wet reduction process for adding a reducing agent to a water reaction system, which contains silver ions, to deposit silver particles by reduction (see, e.g., Japanese Patent Laid-Open No. 8-176620).

However, there are some cases where a silver powder produced by a conventional wet reduction process contains impurities due to entrainment of reacting mother liquor during reduction. Therefore, if a paste containing such a silver powder is used for forming a conductor, there are some cases where the conductor is bulged and/or broken due to volatilization of gas components and so forth during firing.

SUMMARY OF THE INVENTION

It is therefore an object of the present invention to eliminate the aforementioned problems and to provide a silver powder used for forming a paste which is capable of being fired to form a conductor having no bulging and broken portions, and a method for producing the same.

In order to accomplish the aforementioned and other objects, the inventors have diligently studied and found that, if a reducing agent is added to a water reaction system containing silver ions to deposit silver particles by reduction to obtain a silver powder by drying and if the silver powder thus obtained is heat-treated at a temperature of higher than 100° C. and lower than 400° C., preferably at a temperature of 120 to 300° C. and more preferably at a temperature of 150 to 250° C., to be used for forming a paste which is fired to form a conductor, it is possible to obtain a conductor having no bulging and broken portions. Thus, the inventors have made the present invention.

According one aspect of the present invention, there is provided a method for producing a silver powder, the method comprising the steps of: preparing a water reaction system containing silver ions; adding a reducing agent to the water reaction system containing silver ions to deposit silver particles by reduction; drying the silver particles to produce a silver powder; and heat-treating the silver powder at a temperature which is higher than 100° C. and which is lower than 400° C., preferably at a temperature of 120 to 300° C. and more preferably at a temperature of 150 to 250° C. In this method for producing a silver powder, a dispersing agent is preferably added to a slurry-like reaction system before or after the deposition of the silver particles. The dispersing agent is preferably at least one selected from the group consisting of fatty acids, fatty acid salts, surface active agents, organic metals, chelating agents and protective colloids. The reducing agent is preferably at least one selected from the group consisting of ascorbic acid, alkanol amine, hydroquinone, hydrazine and formalin. The reducing agent is preferably added at a rate of not lower than 1 equivalent/minute with respect to the content of silver in the water reaction system containing silver ions.

According to another aspect of the present invention, there is provided a silver powder which has a maximum coefficient of thermal expansion of not greater than 1.5%, preferably not greater than 1.0% and more preferably not greater than 0.5%, at a temperature of 50° C. to 800° C., and an ignition loss of not greater than 1.0% when the silver powder is ignited until the weight of the silver powder is constant at 800° C. The silver powder preferably has no heating peak when the silver powder is heated from 50° C. to 800° C. Preferably, the silver powder has a tap density of not less than 2 $g/cm^3$, and a BET specific surface area of not greater than 5 $m^2/g$.

According to the present invention, it is possible to produce a silver powder used for forming a paste which is capable of being fired to form a conductor having no bulging and broken portions.

BRIEF DESCRIPTION OF THE DRAWING

FIGURE is a graph showing the variations in heating value as DTA curves with respect to temperature in Example 1 and Comparative Example 1.

DESCRIPTION OF THE PREFERRED EMBODIMENTS

In a preferred embodiment of a method for producing a silver powder according to the present invention, after a reducing agent is added to a water reaction system containing silver ions to deposit silver particles by reduction, the silver particles are dried to obtain a silver powder, and then, the silver powder thus obtained is heat-treated at a temperature of higher than 100° C. and lower than 400° C., preferably at a temperature of 120 to 300° C. and more preferably at a temperature of 150 to 250° C. If the heat treatment is not carried out or if the heat treating temperature is not higher than 100° C. the coefficient of thermal expansion of the silver powder increases, so that the silver powder has a heating peak. If a paste containing such a silver powder is used for forming a conductor, volatilization of gas components and so forth are caused during firing, so that the conductor is bulged and/or broken. On the other hand, if the heat treating temperature is not lower than 400° C., an agglomerate silver powder is obtained, so that there is a problem in that a foil is formed during the preparation of a paste or the like. Furthermore, the heat treatment can be carried out in the atmosphere, or in vacuum, or in an atmosphere of an inert gas such as nitrogen or argon gas. It is required to control the heat treating time in accordance with the heat treating temperature and characteristics of the silver powder.

As the water reaction system containing silver ions, an aqueous solution or slurry containing silver nitrate, a silver salt complex or a silver intermediate may be used. The silver salt complex may be produced by adding aqueous ammonia, an ammonium salt, a chelate compound or the like. The silver intermediate may be produced by adding sodium hydroxide, sodium chloride, sodium carbonate or the like. Among them, an ammine complex obtained by adding aqueous ammonia to an aqueous silver nitrate solution is preferably used so that the silver powder has an appropriate particle diameter and a spherical shape. Since the coordination number of the ammine complex is 2, 2 mol or more of ammonia per 1 mol of silver is added.

The reducing agent may be selected from ascorbic acid, sulfites, alkanolamine, aqueous hydrogen peroxide, formic acid, ammonium formate, sodium formate, glyoxal, tartaric acid, sodium hypophosphite, sodium borohydride, hydrazine, hydrazine compounds, hydroquinone, pyrogallol, glucose, gallate, formalin, exsiccated sodium sulfate, and rongalite. Among them, the reducing agent is preferably one or more selected from the group consisting of ascorbic acid, alkanol amine, hydroquinone, hydrazine and formalin. If these reducing agents are used, it is possible to obtain silver particles having appropriate particle diameters.

The reducing agent is preferably added at a rate of 1 equivalent/minute or more in order to prevent the aggregation of the silver powder. Although the reason for this is not clear, it is considered that, if the reducing agent is added in a short time, the deposition of silver particles by reduction is caused all at once to complete reduction in a short time, so that it is difficult to cause the aggregation of produced nuclei, thereby improving dispersibility. Therefore, the time to add the reducing agent is preferably shorter. When reduction is carried out, the solution to be reacted is preferably agitated so as to complete the reaction in a shorter time.

In order to further improve dispersibility, a dispersing agent is preferably added to a slurry-like reaction system before or after the deposition of silver particles. The dispersing agent is preferably one or more selected from the group consisting of fatty acids, fatty acid salts, surface active agents, organic metals, chelating agents and protective colloids.

Examples of fatty acids include propionic acid, caprylic acid, lauric acid, myristic acid, palmitic acid, stearic acid, behenic acid, acrylic acid, oleic acid, linolic acid, and arachidonic acid.

Examples of fatty acid salts include salts formed by fatty acids and metals, such as lithium, sodium, potassium, barium, magnesium, calcium, aluminum, iron, cobalt, manganese, lead, zinc, tin, strontium, zirconium, silver and copper.

Examples of surface active agents include: anionic surface active agents, such as alkyl benzene sulfonates and polyoxyethylene alkyl ether phosphates; cationic surface active agents, such as aliphatic quaternary ammonium salts; amphoteric surface active agents, such as imidazolinium betaine; and nonionic surface active agents, such as polyoxyethylene alkyl ethers and polyoxyethylene fatty acid esters.

Examples of organic metals include acetylacetone tributoxyzirconium, magnesium citrate, diethylzinc, dibutyltin oxide, dimethylzinc, tetra-n-butoxyzirconium, triethyl indium, triethyl gallium, trimethyl indium, trimethyl gallium, monobutyl tin oxide, tetraisocyanate silane, tetramethyl silane, tetramethoxy silane, polymethoxy siloxane, monomethyl triisocyanate silane, silane coupling agent, titanate coupling agents, and aluminum coupling agents.

Examples of chelating agents include imidazole, oxazole, thiazole, selenazole, pyrazole, isoxazole, isothiazole, 1H-1,2,3-triazole, 2H-1,2,3-triazole, 1H-1,2,4-triazole, 4H-1,2,4-triazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1H-1,2,3,4-tetrazole, 1,2,3,4-oxatriazole, 1,2,3,4-thiatriazole, 2H-1,2,3,4-tetrazole, 1,2,3,5-oxatriazole, 1,2,3,5-thiatriazole, indazole, benzoimidazole, benzotriazole and salts thereof, and oxalic acid, succinic acid, malonic acid, glutaric acid, adipic acid, pimelic acid, suberic acid, azelaic acid, sebacic acid, didodecanoic acid, maleic acid, fumaric acid, phthalic acid, isophthalic acid, terephthalic acid, glycolic acid, lactic acid, hydroxy butyric acid, glyceric acid, tartaric acid, malic acid, tartronic acid, hydracrylic acid, mandelic acid, citric acid and ascorbic acid.

Examples of protective colloids include gelatin, albumin, gum arabic, protarbic acid and lysalbic acid.

By the above described preferred embodiment of a method for producing a silver powder according to the present invention, it is possible to produce a silver powder which has a maximum coefficient of thermal expansion of not greater than 1.5%, preferably not greater than 1.0% and more preferably not greater than 0.5%, at a temperature of 50° C. to 800° C., and which has no heating peak when the silver powder is heated from 50° C. to 800° C., the silver powder having an ignition loss of not greater than 1.0% when the silver powder is ignited until the weight of the silver powder is constant at 800° C., and the silver powder having a tap density of not less than 2 g/cm$^3$ and a BET specific surface area of not greater than 5 m$^2$/g.

If such a silver powder is used for forming a paste to be fired to form a conductor, it is possible to decrease the expansion of the conductor due to volatilization of volatile components, and it is possible to decrease the sudden heating due to heating components, so that it is possible to form a conductor having no bulging and/or broken portions. If the silver powder has a spherical shape, the silver powder can be suitably used for carrying out a photosensitive paste method. In addition, if the silver powder has an undecided shape or a flake shape, there is a disadvantage in that the photosensitive characteristics of the silver powder are not good since the irregular reflection and/or scattering of ultraviolet rays is caused. However, if the silver powder has a spherical shape, the silver powder is also suitably used for carrying out a printing or transferring method. Moreover, if the tap density is less than 2 g/cm$^3$, the aggregation of particles of the silver powder is violently caused, so that it is difficult to form a fine line even if any one of the above described methods is used. If the BET specific surface area is greater than 5 m$^2$/g, the viscosity of the paste is too high, so that workability is not good.

Examples of a silver powder and a method for producing the same according to the present invention will be described below in detail.

Example 1

To 3600 ml of an aqueous solution containing 12 g/l silver nitrate as silver ions, 180 ml of industrial aqueous ammonia was added to form an aqueous silver ammine complex solution. To the aqueous silver ammine complex solution thus formed, 1 g of sodium hydroxide was added to control the pH of the solution. Then, 192 ml of industrial formalin serving as a reducing agent was added to the solution in 5 seconds. Immediately thereafter, 0.1 g of stearic acid was added to the solution to obtain a silver slurry. Then, the silver slurry thus obtained was filtered, washed with water, and dried to obtain a silver powder. Then, the silver powder thus obtained was heat-treated at 150° C. for 6 hours in the atmosphere.

The coefficient of thermal expansion, heating value, ignition loss, BET specific surface area and tap density of the silver powder thus obtained were measured. In addition, the sintered body prepared using a paste containing the silver power was evaluated. Furthermore, it was confirmed by a scanning electron microscope (SEM) that the silver powders obtained in this example and in examples and comparative examples 1 and 2 described later were silver powders.

By means of a thermal expansion coefficient measuring apparatus (DILATO METAER 5000 produced by MAC SCIENCE/BRUKER axs), the coefficient of thermal expansion was obtained from the following expression on the basis of the length of a pellet-like sample of silver powder having a diameter of 5 mm, which was uniaxially formed by applying a pressure of 250 kg/cm$^2$ to the silver powder in a die, when the sample was heated from 50° C. to 800° C. at a temperature rising rate of 10° C./minute:

Coefficient (%) of Thermal Expansion at $T$ ° C.=$(L_T-L_{50})/L_{50} \times 100$ wherein $L_{50}$ and $L_T$ are lengths (mm) of the pellet-like sample of silver powder when the temperature of the sample is 50° C. and $T$ ° C., respectively.

By means of a heating value measuring apparatus (TG-DTA 2000 Measuring Apparatus produced by MAC SCIENCE/BRUKER axs), the measurement of the heating value of the silver powder was carried out by measuring a heating value when 20±1 mg of the sample of silver powder put on a pan (an alumina measuring pan produced by Rigaku Co., Ltd.) was heated from 50° C. to 800° C. at a temperature rising rate of 10° C./minute in the atmosphere (no ventilation). Furthermore, 20.0 mg of alumina was used as a standard sample, and the heating peak temperature was obtained by analysis using software attached to the measuring apparatus.

After 2 g of the sample of silver powder was weighted (w1) to be put in a ceramic melting pot to be ignited for 30 minutes until the weight of the sample was constant at 800° C., the sample was cooled to be weighted (w2). Then, the ignition loss was obtained from the following expression.

Ignition Loss (%)=$(w1-w2)/w1 \times 100$

The evaluation of the sintered body was carried out as follows. First, 84 parts by weight of the silver powder, 6 parts by weight of an acrylic resin (BR-105 commercially available from Mitsubishi Rayon Co., Ltd.), 9 parts by weight of an organic solvent (diethylene glycol monoethyl ether acetate (reagent)), and 1 part by weight of a glass frit of PbO—$B_2O_3$—$SiO_2$ were measured to be kneaded by a three-roll mill to prepare a paste. Then, the paste was screen-printed on a green sheet, which contained a glass frit of $B_2O_3$—$SiO_2$-$Al_2O_3$ and alumina powder, by means of a plate having a line width of 150 μm, to be dried. The same five screen-printed sheets were prepared to be stacked to be pressed while being heated. Thereafter, the pressed sheets were fired at 800° C. for 30 minutes. The evaluation of a sintered body thus obtained was carried out by observing bulging and broken portions thereof.

As a result, the maximum coefficient of thermal expansion was 0.35% at 250° C., and no heating peak appeared as shown in FIGURE. The ignition loss was 0.86%, the BET specific surface area was 0.26 m$^2$/g, and the tap density was 4.0 g/cm$^3$. The sintered body had no bulging and broken portions. Furthermore, in FIGURE, the axis of ordinates indicates the difference in temperature between a sample to be measured and a standard sample as a heating value by the electromotive force (μV) of thermocouple.

Example 2

With respect to a silver powder obtained by the same method as that in Example 1, except that the heat treatment was carried out at 250° C. for two hours, the coefficient of thermal expansion, ignition loss, heating value, BET specific surface area and tap density of the silver powder were measured by the same methods as those in Example 1, and the sintered body was evaluated by the same method as that in Example 1.

As a result, the maximum coefficient of thermal expansion was 0.12% at 170° C., and no heating peak appeared. The ignition loss was 0.53%, the BET specific surface area was 0.22 m$^2$/g, and the tap density was 4.1 g/cm$^3$. The sintered body had no bulging and broken portions.

Example 3

To 3600 ml of an aqueous solution containing 12 g/l silver nitrate as silver ions, 140 ml of industrial aqueous ammonia was added to form an aqueous silver ammine complex solution. To the aqueous silver ammine complex solution thus formed, 17 ml of a solution containing 60% of hydrazine serving as a reducing agent was added to the solution. Immediately thereafter, 0.2 g of oleic acid serving as a dispersing agent was added to the solution to obtain a silver slurry. Then, the silver slurry thus obtained was filtered, washed with water, and dried to obtain a silver powder. Then, the silver powder thus obtained was heat-treated at 150° C. for 6 hours in the atmosphere.

With respect to the silver powder thus obtained, the coefficient of thermal expansion, ignition loss, heating value, BET specific surface area and tap density of the silver powder were measured by the same methods as those in Example 1, and the sintered body was evaluated by the same method as that in Example 1.

As a result, the maximum coefficient of thermal expansion was 0.04% at 160° C., and no heating peak appeared. The ignition loss was 0.21%, the BET specific surface area was 0.89 m$^2$/g, and the tap density was 2.5 g/cm$^3$. The sintered body had no bulging and broken portions.

Comparative Example 1

With respect to a silver powder obtained by the same method as that in Example 1, except that the heat treatment was not carried out, the coefficient of thermal expansion, ignition loss, heating value, BET specific surface area and tap density of the silver powder were measured by the same methods as those in Example 1, and the sintered body was evaluated by the same method as that in Example 1.

As a result, the ignition loss was 0.68%, the BET specific surface area was 0.25 m$^2$/g, and the tap density was 5.4 g/cm$^3$. However, the maximum coefficient of thermal expansion reached 4.7% at 290° C., and a heating peak having a heating peak temperature of 218.4° C. appeared as shown in FIGURE. In addition, the sintered body had bulging and broken portions.

Comparative Example 2

With respect to a silver powder obtained by the same method as that in Example 1, except that the heat treatment was carried out at 100° C. for twenty hours, the coefficient of thermal expansion, ignition loss, heating value, BET specific surface area and tap density of the silver powder were measured by the same methods as those in Example 1, and the sintered body was evaluated by the same method as that in Example 1.

As a result, the ignition loss was 0.67%, the BET specific surface area was 0.27 m$^2$/g, and the tap density was 5.6 g/cm$^3$.

However, the maximum coefficient of thermal expansion reached 3.8% at 290° C., and a heating peak having a heating peak temperature of 217.4° C. appeared. In addition, the sintered body had bulging and broken portions.

Comparative Example 3

With respect to a silver powder obtained by the same method as that in Example 1, except that the heat treatment was carried out at 450° C. for two hours, the coefficient of thermal expansion, ignition loss, heating value, BET specific surface area and tap density of the silver powder were measured by the same methods as those in Example 1, and the sintered body was evaluated by the same method as that in Example 1.

As a result, the maximum coefficient of thermal expansion was 0.01% at 150° C., and no heating peak appeared. The ignition loss was 0.13%, the BET specific surface area was 0.06 m²/g, and the tap density was 4.6 g/cm³. However, since a large amount of foil was produced during the kneading by a three-roll mill, the evaluation of the sintered body was not carried out.

Furthermore, it was confirmed by SEM that the heat-treated silver powder was a sintered body, so that it was not possible to confirm the shape of the silver powder.

These results are shown in Table.

TABLE

|  | Maximum Coef of Thermal Expansion (%) | Heating Peak Temp. (° C.) | Ignition Loss (%) | Specific Surface Area (m²/g) | Tap Density (g/cm³) | Shape of Silver Powder |
| --- | --- | --- | --- | --- | --- | --- |
| Ex. 1 | 0.35 | — | 0.86 | 0.26 | 4.0 | sphere |
| Ex. 2 | 0.12 | — | 0.53 | 0.22 | 4.1 | sphere |
| Ex. 3 | 0.04 | — | 0.21 | 0.89 | 2.5 | sphere |
| Comp. 1 | 4.7 | 218.4 | 0.68 | 0.25 | 5.4 | sphere |
| Comp. 2 | 3.8 | 217.4 | 0.67 | 0.27 | 5.6 | sphere |
| Comp. 3 | 0.01 | — | 0.13 | 0.06 | 4.6 | sintered |

What is claimed is:

1. A spherical silver powder which has a maximum coefficient of thermal expansion of not greater than 1.5% at a temperature of 50° C. to 800° C., which has no heating peak when the silver powder is heated from 50° C. to 800° C. and which has an ignition loss of 0.21 to 0.86% when the silver powder is ignited until the weight of the silver powder is constant at 800° C.

2. A spherical silver powder as set forth in claim 1, which said maximum coefficient of thermal expansion of not greater than 1.0% at a temperature of 50° C. to 800° C.

3. A spherical silver powder as set forth in claim 1, which said maximum coefficient of thermal expansion of not greater than 0.5% at a temperature of 50° C. to 800° C.

4. A spherical silver powder as set forth in claim 1, which has a tap density of 2.5 to 4.1 g/cm³, and a BET specific surface area of not greater than 5 m²/g.

5. A spherical silver powder, which has no heating peak when the silver powder is heated from 50° C. to 800° C., which has a maximum coefficient of thermal expansion of not greater than 1.5% at a temperature of 50° C. to 800° C., the coefficient of thermal expansion at T° C. being equal to $(L_T-L_{50})/L_{50} \times 100$ wherein $L_{50}$ and $L_T$ are lengths (mm) of a pellet-like sample of said silver powder when the temperature of the sample is 50° C. and T° C., respectively, and which has an ignition loss of 0.21 to 0.86% when the silver powder is ignited until the weight of the silver powder is constant at 800° C.

* * * * *